(12) United States Patent
Kuwahara (10) Patent No.: US 12,083,712 B2
(45) Date of Patent: Sep. 10, 2024

(54) METHOD FOR PRODUCING FLEXIBLE MOLD, FLEXIBLE MOLD SUBSTRATE AND METHOD FOR PRODUCING OPTICAL COMPONENT

(71) Applicant: Nippon Electric Glass Co., Ltd., Shiga (JP)

(72) Inventor: Koji Kuwahara, Shiga (JP)

(73) Assignee: NIPPON ELECTRIC GLASS CO., LTD., Shiga (JP)

( * ) Notice: Subject to any disclaimer, the term of this patent is extended or adjusted under 35 U.S.C. 154(b) by 292 days.

(21) Appl. No.: 17/277,394

(22) PCT Filed: Aug. 20, 2019

(86) PCT No.: PCT/JP2019/032498
§ 371 (c)(1),
(2) Date: Mar. 18, 2021

(87) PCT Pub. No.: WO2020/059390
PCT Pub. Date: Mar. 26, 2020

(65) Prior Publication Data
US 2022/0032507 A1 Feb. 3, 2022

(30) Foreign Application Priority Data
Sep. 21, 2018 (JP) .................. 2018-177825

(51) Int. Cl.
B29C 33/38 (2006.01)
B29C 33/42 (2006.01)
(Continued)

(52) U.S. Cl.
CPC ........ *B29C 33/3857* (2013.01); *B29C 33/424* (2013.01); *B29C 59/02* (2013.01);
(Continued)

(58) Field of Classification Search
CPC ... B29C 33/3857; B29C 33/424; B29C 59/02; B29C 2033/385; B29D 11/0073; B29K 2909/08
See application file for complete search history.

(56) References Cited

U.S. PATENT DOCUMENTS

2010/0276066 A1  11/2010  Kondo
2017/0227696 A1*  8/2017  Ookawa .................... B05D 3/06
2018/0229477 A1*  8/2018  Koike ....................... G03F 1/48

FOREIGN PATENT DOCUMENTS

CN  1708705      12/2005
CN  1708705 A  * 12/2005 ............... B05D 5/10
(Continued)

OTHER PUBLICATIONS

English translation of WO-2015037601-A1 (OA Appendix). (Year: 2015).*
(Continued)

*Primary Examiner* — Timothy Kennedy
*Assistant Examiner* — Inja Song
(74) *Attorney, Agent, or Firm* — Wenderoth, Lind & Ponack, L.L.P.

(57) ABSTRACT

Provided is a base (1) for a flexible mold, including: a glass sheet (2); a resin sheet (3); and a bonding layer (4) configured to bond the glass sheet (2) and the resin sheet (3) to each other, wherein the resin sheet (3) protrudes from the glass sheet (2).

5 Claims, 4 Drawing Sheets

(51) Int. Cl.
   *B29C 59/02* (2006.01)
   *B29D 11/00* (2006.01)

(52) U.S. Cl.
   CPC .... *B29D 11/0073* (2013.01); *B29C 2033/385* (2013.01); *B29K 2867/003* (2013.01); *B29K 2909/08* (2013.01)

(56) References Cited

FOREIGN PATENT DOCUMENTS

| | | | | |
|---|---|---|---|---|
| JP | 2006/258999 | | 9/2006 | |
| JP | 2011-001520 | | 1/2011 | |
| JP | 2011-253836 | | 12/2011 | |
| JP | 2014-14996 | | 1/2014 | |
| JP | 2015-27798 | | 2/2015 | |
| JP | 2019-155636 | | 9/2019 | |
| JP | 2019155636 A | * | 9/2019 | |
| TW | 200948604 | | 12/2009 | |
| WO | 2015-037601 | | 3/2015 | |
| WO | WO-2015037601 A1 | * | 3/2015 | ........... G02B 3/0031 |

OTHER PUBLICATIONS

English translation of CN-1708705-A by EPO. (Year: 2005).*
English translation of JP-2019155636-A by EPO. (Year: 2019).*
International Preliminary Report on Patentability and Written Opinion of the International Searching Authority issued Mar. 23, 2021 in International (PCT) Application No. PCT/JP2019/032498.
Extended European Search Report issued May 16, 2022 in corresponding European Patent Application No. 19863636.7.
International Search Report issued Nov. 19, 2019 in International (PCT) Application No. PCT/JP2019/032498.
Office Action issued Feb. 18, 2023 in corresponding Taiwanese Patent Application No. 108131586, with English-language translation of the Search Report.
Office Action issued May 20, 2022 in corresponding Chinese Patent Application No. 201980060454.9 w/English translation.

* cited by examiner

METHOD FOR PRODUCING FLEXIBLE MOLD, FLEXIBLE MOLD SUBSTRATE AND METHOD FOR PRODUCING OPTICAL COMPONENT

TECHNICAL FIELD

The present invention relates to a manufacturing method for a flexible mold, a base for a flexible mold, and a manufacturing method for an optical component using a flexible mold.

BACKGROUND ART

For example, in a manufacturing process for an optical device, a flexible mold having such flexibility that enables bending deformation is used in some cases. As one of methods of manufacturing a flexible mold, there is given an imprint method. In the imprint method, a molding material is sandwiched between a master mold and a base so that an uneven layer obtained by transferring an uneven pattern of the master mold to the molding material is formed on the base. As a result, a flexible mold including the base and the uneven layer is obtained.

As a base for a flexible mold, for example, as disclosed in Patent Literature 1, there is given a base that includes a glass sheet to reduce a change in dimension of a flexible mold due to a change in temperature. Further, in Patent Literature 1, there is disclosed a base having a resin layer that is formed on a main surface of a glass sheet on one side because, for example, formation of cracks is liable to occur when the base is formed only of the glass sheet.

CITATION LIST

Patent Literature 1: WO 2015/037601 A1

SUMMARY OF INVENTION

Technical Problem

In the base for a flexible mold as disclosed in Patent Literature 1, an end surface of the glass sheet and an end surface of the resin layer are flush with each other (see, for example, FIG. 1 of Patent Literature 1). Thus, another member is more liable to come into contact with the end surface of the glass sheet included in the base in the process of manufacturing the flexible mold or in a process of manufacturing an optical component (for example, optical device) using the flexible mold having been manufactured. As a result, formation of broken pieces of glass (including glass powder) is liable to occur from the end surface of the glass sheet, causing contamination of a surrounding environment in the above-mentioned processes.

The present invention has an object to reduce formation of broken pieces of glass in a process of manufacturing a flexible mold and/or a process of manufacturing an optical component using the flexible mold having been manufactured.

Solution to Problem

According to one embodiment of the present invention, which has been devised in order to solve the above-mentioned problem, there is provided a manufacturing method for a flexible mold, the flexible mold comprising: a base; and an uneven layer formed on the base, the manufacturing method comprising: a transfer step of sandwiching a molding material between the base and a master mold so that the uneven layer obtained by transferring an uneven pattern of the master mold to the molding material is formed on the base, wherein the base comprises: a glass sheet; a resin sheet; and a bonding layer configured to bond the glass sheet and the resin sheet to each other, and wherein the resin sheet protrudes from the glass sheet. With such configuration, the resin sheet protrudes from the glass sheet in the base. Thus, the end surfaces of the glass sheet are less liable to come into contact with another member. Consequently, when a flexible mold is manufactured through use of the base, a flexible mold which may reduce the formation of broken pieces of glass can be provided.

In the above-mentioned configuration, the resin sheet may be bonded to only one main surface of the glass sheet through intermediation of the bonding layer. With such configuration, a configuration of the base is simplified. Thus, the flexible mold can be manufactured with low cost.

When the resin sheet is arranged only on the one main surface of the glass sheet, it is preferred that the glass sheet and the resin sheet each protrude from the bonding layer. With such configuration, the bonding layer does not protrude toward the outer side of the base. Thus, contamination of a surrounding environment with an adhesive can be prevented.

In the above-mentioned configuration, the resin sheet may be bonded to each of both main surfaces of the glass sheet through intermediation of the bonding layer. With such configuration, both the main surfaces of the glass sheet are protected by the resin sheets. Thus, the glass sheet is less liable to be broken. Further, in case of breakage of the glass sheet, broken pieces of glass are likely to stay between the resin sheets provided on both sides. Thus, the broken pieces of glass are less liable to scatter to the surrounding. Further, even when the base is heated, for example, by a heat treatment, stresses which are caused by the resin sheets and act on both the main surfaces of the glass sheet are substantially the same. Thus, occurrence of such a warp that causes the glass sheet to protrude on one main surface side can be suppressed.

When the resin sheet is arranged on each of both the main surfaces of the glass sheet, it is preferred that both the resin sheets each protrude from the bonding layer. With such configuration, the bonding layer does not protrude toward the outer side of the base. Thus, contamination of a surrounding environment with an adhesive can be prevented.

When the resin sheet is arranged on each of both the main surfaces of the glass sheet, it is preferred that end surfaces of the glass sheet be covered by the bonding layer. With such configuration, the end surfaces of the glass sheet are protected by the bonding layer. Thus, formation of broken pieces of glass from the end surfaces of the glass sheet can reliably be suppressed. Further, in case of breakage of the end surfaces of the glass sheet, the broken pieces of glass are less liable to scatter to the surrounding.

When the resin sheet is arranged on each of both the main surfaces of the glass sheet, one of the resin sheets may be flat in a plane direction of the glass sheet, and another one of the resin sheets may comprise step portions, which are located at portions protruding from the glass sheet and extend toward the one of the resin sheets. With such configuration, front and back surfaces of the base can easily be distinguished based on the presence or absence of the step portions. That is, for example, when the uneven layer is formed on the main surface of the flat one of the resin sheets, the surface having the uneven layer formed thereon can easily be distinguished based on the presence or absence of the step portions.

In the above-mentioned configuration, it is preferred that the base comprise a protective film that is removably laminated on at least one of main surfaces of the base. With such configuration, damage and adhesion of dirt on the surface of the base can be prevented. Thus, for example, when the protective film is laminated on the surface of the base on which the uneven layer is to be formed, and the protective film is removed immediately before the uneven layer is formed, the uneven layer can be formed with high accuracy.

According to one embodiment of the present invention, which has been devised in order to solve the above-mentioned problem, there is provided a base for a flexible mold, comprising: a glass sheet; a resin sheet; and a bonding layer configured to bond the glass sheet and the resin sheet to each other, wherein the resin sheet protrudes from the glass sheet. When the flexible mold is manufactured with use of the base having such configuration, actions and effects which are similar to those obtained with the corresponding configuration described above can be obtained.

In the above-mentioned configuration, the resin sheet may be bonded to only one main surface of the glass sheet through intermediation of the bonding layer.

In the above-mentioned configuration, the resin sheet may be bonded to each of both main surfaces of the glass sheet through intermediation of the bonding layer.

According to one embodiment of the present invention, which has been devised in order to solve the above-mentioned problem, there is provided a manufacturing method for an optical component, the optical component comprising: a substrate; and an uneven layer formed on the substrate, the manufacturing method comprising: a transfer step of sandwiching a molding material between the substrate and a flexible mold so that the uneven layer obtained by transferring an uneven pattern of the flexible mold to the molding material is formed on the substrate, wherein the flexible mold comprises: a glass sheet; a resin sheet; and a bonding layer configured to bond the glass sheet and the resin sheet to each other, and wherein the resin sheet protrudes from the glass sheet. With such configuration, the resin sheet protrudes from the glass sheet in the flexible mold. Thus, the end surfaces of the glass sheet are less liable to come into contact with another member. Consequently, when the optical component is manufactured through use of the flexible mold, the formation of broken pieces of glass can reliably be reduced.

Advantageous Effects of Invention

According to the present invention, the formation of broken pieces of glass can reliably be reduced in the process of manufacturing a flexible mold and/or the process of manufacturing an optical component using the flexible mold having been manufactured.

DESCRIPTION OF EMBODIMENTS

Embodiments of the present invention are described below with reference to the accompanying drawings.

First Embodiment

Figure 1:
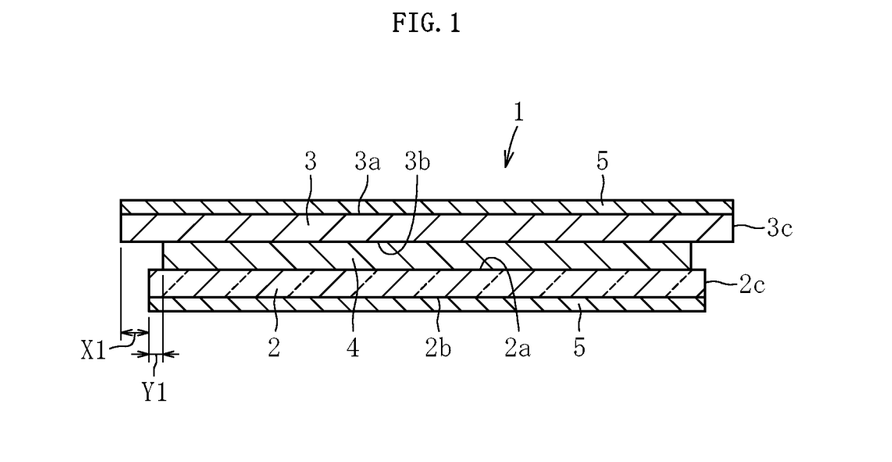
FIG. 1 is a sectional view for illustrating a base for a flexible mold according to a first embodiment.

As illustrated in FIG. 1, a base 1 for a flexible mold according to a first embodiment comprises a glass sheet 2, a resin sheet 3, and a bonding layer 4. The bonding layer 4 is configured to bond a first main surface 2a of the glass sheet 2 and a second main surface 3b of the resin sheet 3 to each other. That is, the resin sheet 3 is bonded only on the first main surface 2a side of the glass sheet 2. Here, the term "flexible" means a state of having such flexibility that enables bending deformation. Thus, the base 1 also has the flexibility that enables bending deformation. Under a state in which the bending deformation does not occur in the base 1 (state of FIG. 1), both the glass sheet 2 and the resin sheet 3 are flat in a plane direction of the glass sheet 2.

The shape of the glass sheet 2 is not particularly limited and may be, for example, a circular shape. In this embodiment, the glass sheet 2 has a rectangular shape.

It is preferred that the glass sheet 2 have a thickness of from 10 μpm to 500 μm, more preferably from 50 μm to 200 μm, still more preferably from 50 μm to 100 μm. The flexibility is liable to be degraded when the glass sheet 2 is excessively thick, which may cause degradation in ease of separation in a separation step included in a manufacturing process for a flexible mold or a manufacturing process for an optical component. Meanwhile, when the glass sheet 2 is excessively thin, there is a fear in that the mechanical strength is degraded.

Examples of a composition of the glass sheet 2 include non-alkali glass, borosilicate glass, soda glass (soda-lime glass), high-silica glass, and other oxide-based glass containing silicon oxide as a main component. The glass sheet 2 maybe made of chemically reinforced glass. In this case, aluminosilicate glass can be used. It is preferred that the glass sheet 2 have a high transmittance for ultraviolet rays (365 nm) and a low thermal expansion coefficient. Specifically, it is preferred that the glass sheet 2 be made of non-alkali glass that is used for a glass substrate for a display.

From the viewpoint of securing the high transmittance for ultraviolet rays (365 nm) and the low thermal expansion coefficient, it is preferred that the non-alkali glass contain, in terms of mass %, $SiO_2$ at 50% to 70%, $Al_2O_3$ at 12% to 25%, $B_2O_3$ at 0% to 12%, $Li_2O+Na_2O+K_2O$ (total amount of $Li_2O$, $Na_2O$, and $K_2O$) at 0% to 1% exclusive, MgO at 0% to 8%, CaO at 0% to 15%, SrO at 0% to 12%, and BaO at 0% to 15%. Further, it is more preferred that the above-mentioned non-alkali glass contain, in terms of mass %, $SiO_2$ at 50% to 70%, $Al_2O_3$ at 12% to 22% (in particular, 15% to 20%), $B_2O_3$ at 7% to 15% (in particular, 9% to 13%), $Li_2O+Na_2O+K_2O$ at 0% to 1% exclusive (in particular, 0% to 0.50), MgO at 0% to 3%, CaO at 6% to 13% (in particular, 7% to 12%), SrO at 0.1% to 5% (in particular, 0.5% to 40), and BaO at 0% to 2% (in particular, 0.1% to 1.50).

The glass sheet 2 is formed by a publicly known forming method such as a float method or a down-draw method. Of those, it is preferred that the glass sheet 2 be formed by an overflow down-draw method. In such a manner, there is an advantage in that the surface of the glass sheet 2 is formed into a fire-polished surface not subjected to a polishing treatment, which is significantly smooth.

The shape of the resin sheet 3 is not particularly limited and may be, for example, a circular shape. In this embodiment, the resin sheet 3 has a rectangular shape.

The resin sheet 3 is larger than the glass sheet 2, and protrudes from the glass sheet 2 in plan view in a laminated state. In this embodiment, the resin sheet 3 protrudes along an entire periphery of the glass sheet 2. That is, the resin sheet 3 protrudes from all of four sides of the glass sheet 2. With such configuration, when another member comes into contact with the end surfaces of the base 1, end surfaces 3c of the resin sheet 3 preferentially come into contact with the another member. Accordingly, end surfaces 2c of the glass sheet 2 are less liable to come into contact with the another member. Consequently, breakage of the end surfaces 2c of the glass sheet 2 and formation of broken pieces of glass can be prevented.

It is preferred that a protruding amount X1 of the resin sheet 3 from the glass sheet 2 be from 0.2 mm to 100 mm, more preferably from 0.2 mm to 1 mm from the viewpoint of preventing degradation in dimensional accuracy caused by extension of the protruding resin sheet 3.

It is preferred that the resin sheet 3 have a thickness of from 10 μm to 500 μm. However, it is more preferred that the resin sheet 3 have a thickness of from 30 μm to 300 μm from the viewpoint of improving the flexibility and the ultraviolet-ray transmittance, still more preferably from 50 μm to 200 μm from the viewpoint of improving the ease of handling. Further, when the base 1 is subjected to a heat treatment (for example, heat treatment at about 100° C.), there is a fear in that such a warp that causes the glass sheet 2 side of the base 1 to project occurs due to a difference in expansion coefficient between the glass sheet 2 and the resin sheet 3. Thus, from the viewpoint of preventing the warp, it is preferred that the resin sheet 3 have a thickness of from 0.2 times to 1 time the thickness of the glass sheet 2, more preferably from 0.3 times to 0.5 times.

It is preferred that the material of the resin sheet 3 have at least one of the following properties (1) to (4). That is, it is preferred that the material of the resin sheet 3 (1) have an easy-bonding layer that is less liable to repel ink for, for example, printing (for example, COSMOSHINE (trademark) manufactured by TOYOBO Co., LTD), (2) be highly transparent for optics (total light-ray transmittance (550 nm) is from 80% to 950), (3) be an annealed product in the case of a biaxially drawn sheet (for example, a low thermally-contractable product or an isotropic product), and (4) be a resin material that allows ultraviolet rays to transmit therethrough.

As the material of the resin sheet 3, for example, epoxy (EP), polyamide (PA), polyamide imide (PAI), polyether ether ketone (PEEK), polybenzimidazole (PBI), polyethylene terephthalate (PET), polyether sulfone (PES), cyclic polyolefin (COP), polycarbonate (PC), polyvinyl chloride (PVC), acryl (PMMA), or urethane (PU) may be adopted.

It is preferred that the resin sheet 3 have a high transmittance for ultraviolet rays (365 nm), and it is preferred that the transmittance of the resin sheet 3 as a single member for ultraviolet rays be from 50% to 90%. In this viewpoint, it is preferred that the material of the resin sheet 3 be polyethylene terephthalate (PET). It is preferred that the transmittance of the entire base 1 for ultraviolet rays be from 50% to 90%.

It is preferred that the bonding layer 4 have a thickness of from 10 μm to 500 μm, more preferably from 25 μm to 100 μm. It is preferred that the bonding layer 4 be thin from the viewpoint of improving the flexibility. It is preferred that the thickness of the bonding layer 4 be smaller than the thicknesses of the glass sheet 2 and the resin sheet 3.

Examples of the material of the bonding layer 4 include an optically transparent adhesive sheet and a pressure-sensitive adhesive sheet (PSA). As an adhesive component of the bonding layer 4, an acrylic adhesive, a silicon-based adhesive, an epoxy-based adhesive, or a photocurable adhesive (for example, ultraviolet-ray curable adhesive) can be used. In the case of the ultraviolet-ray curable adhesive, it is preferred that the transmittance for ultraviolet rays (365 nm) after curing be from 70% to 80%. The bonding layer 4 may comprise a resin base or comprise no resin base. From the viewpoint of improving the flexibility of the bonding layer 4 to improve ease of separating the base 1 in a separation step described later, it is preferred that the bonding layer 4 be formed of the optically transparent adhesive sheet.

The bonding layer 4 may protrude from at least one of the glass sheet 2 or the resin sheet 3. In this embodiment, both the glass sheet 2 and the resin sheet 3 protrude from the bonding layer 4. With such configuration, the bonding layer 4 does not protrude toward the outer side of the base 1. Thus, contamination of a surrounding environment with an adhesive can be prevented.

It is preferred that a protruding amount Y1 of the glass sheet 2 from the bonding layer 4 be from 0.2 mm to 1 mm.

In this embodiment, the base 1 further comprises protective films 5 removably affixed to a first main surface 3a of the resin sheet 3 and to a second main surface 2b of the glass sheet 2, respectively. With such configuration, damage and adhesion of dirt on the first main surface 3a of the resin sheet 3 and the second main surface 2b of the glass sheet 2 can be prevented. One or both of the protective films 5 affixed to the first main surface 3a of the resin sheet 3 and the second main surface 2b of the glass sheet 2 may be omitted.

Although illustration is omitted, the protective films 5 each comprise a resin base and an adhesive layer (adsorption layer). It is preferred that the resin base have a thickness of from 5 μm to 100 μm. It is preferred that the adhesive layer have a thickness of from 1 μm to 50 μm. It is preferred that the adhesive layer have low viscosity. Here, the term "low viscosity" means that the adhesion strength (peel strength) measured through a 180° peel strength test (conforming to JIS Z 0237:2009) is from 0.01 N/25 mm to 0.1 N/25 mm.

Examples of the resin base include PET and polyethylene (PE). As the protective films 5, for example, self-adhesive films can be used.

A manufacturing method for a flexible mold 6 using the base 1 having the configuration described above comprises, as illustrated in FIG. 2A to FIG. 2D, an application step, a transfer step, and a separation step. In this embodiment, before the application step, the protective films 5 are removed from the resin sheet 3 of the base 1.

Figure 2A:
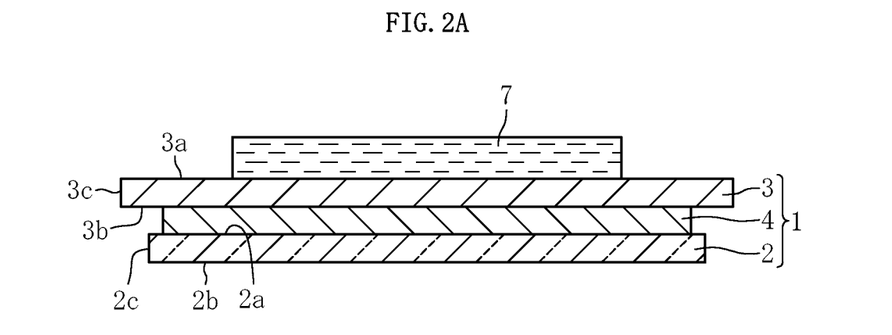
FIG. 2A is a sectional view for illustrating a manufacturing method for the flexible mold according to the first embodiment.

As illustrated in FIG. 2A, in the application step, a liquid molding material 7 is applied to the first main surface 3a of the resin sheet 3 included in the base 1. Here, when the molding material 7 is applied to the resin sheet 3, the adhesion of the molding material 7 can be secured without any special surface treatment.

An application region of the molding material 7 is not particularly limited as long as the application region is located within the first main surface 3a of the resin sheet 3. In this embodiment, the application region is located within an area of the first main surface 3a in which the resin sheet 3 and the glass sheet 2 overlap each other. Within the area in which the resin sheet 3 and the glass sheet 2 overlap each other, the change in dimension of the resin sheet 3 due to expansion is likely to be regulated by the glass sheet 2. Accordingly, high dimensional stability derived from the glass sheet 2 can easily be maintained even on the resin sheet 3. Thus, an uneven pattern having high accuracy can be formed in the transfer step.

Any material generally used for an imprint method can be used as the material of the molding material 7, and the material is suitably selected according to a type of the imprint method. In the case of a thermal imprint method, examples of the material of the molding material 7 include a thermoplastic resin and a thermosetting resin. In the case of a photo-imprint method, examples of the material of the molding material 7 include a photo-curing resin. In this embodiment, the photo-imprint method using ultraviolet rays is used as the imprint method, and an ultraviolet-ray curable resin is used as the molding material 7.

An application method for the molding material 7 is not particularly limited, and examples thereof include a die coating method, a roll coating method, a gravure coating method, an ink jet printing method, a spray coating method, a spin coating method, a flow coating method, a blade coating method, and a dip coating method.

In the application step, instead of applying the molding material 7 to the base 1, the molding material 7 may be applied to a master mold 8.

Figure 2B:
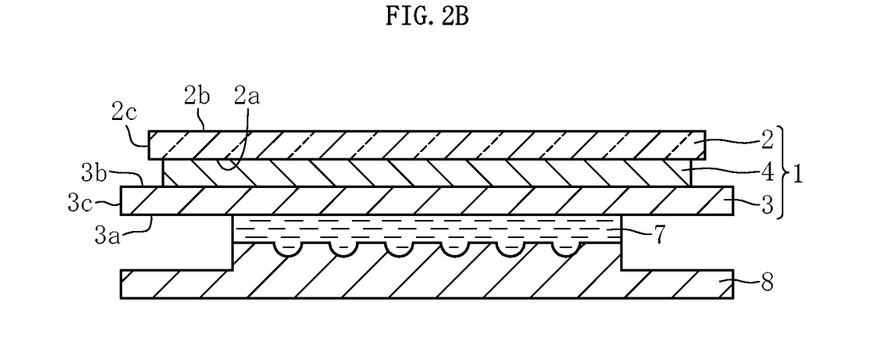
FIG. 2B is a sectional view for illustrating the manufacturing method for the flexible mold according to the first embodiment.

As illustrated in FIG. 2B, in the transfer step, the molding material 7 is sandwiched between the base 1 and the master mold 8 so that an uneven layer 9 obtained by transferring an uneven pattern of the master mold 8 to the molding material 7 is formed on the base 1. The uneven layer 9 is obtained by solidifying the molding material 7 under the state in which the molding material 7 is sandwiched between the base 1 and the master mold 8 (see FIG. 2C). Here, the solidifying includes hardening.

The master mold 8 is obtained through precise formation of the uneven pattern by, for example, NC processing, photolithography, or electron beam lithography. The master mold 8 is formed of, for example, silicon, a silicon oxide film, silica glass, resin, or metal. The master mold 8 has a plate-like shape in this embodiment, but may be in an endless manner, for example, in a form of an endless belt or a roll.

In this embodiment, the photo-imprint method using ultraviolet rays as the light for solidifying the molding material 7 is used. That is, the molding material 7 is solidified by irradiating the molding material 7 with ultraviolet rays. The ultraviolet rays are radiated from the base 1 side. However, when the master mold 8 has ultraviolet-ray transmittance, the ultraviolet rays maybe radiated from the master mold 8 side. When the ultraviolet rays are radiated in such a manner, in order to accelerate a solidification reaction, the molding material 7 may be heated.

In the case of using the photo-imprint method, the light to be radiated is suitably changed according to a kind of the molding material 7. For example, visible light or infrared rays may also be used. Further, in the case of using the thermal imprint method, for example, the molding material 7 is solidified by heating the molding material 7 from at least one of the base 1 side and the master mold 8 side.

Figure 2C:
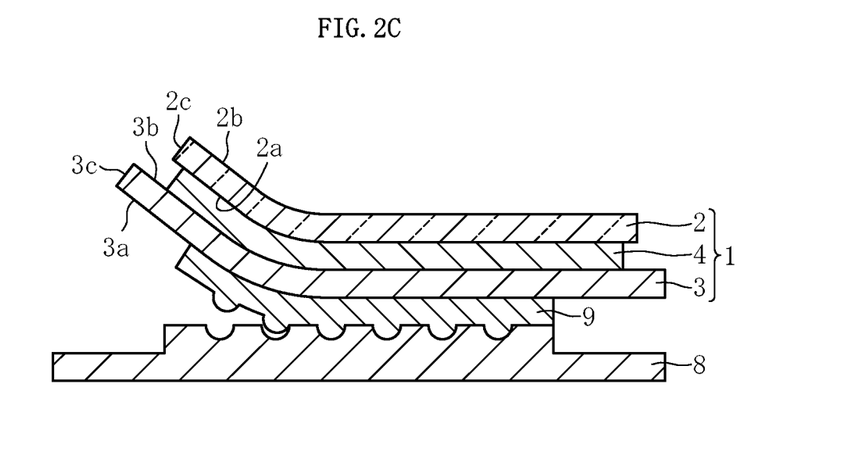
FIG. 2C is a sectional view for illustrating the manufacturing method for the flexible mold according to the first embodiment.
Figure 2D:
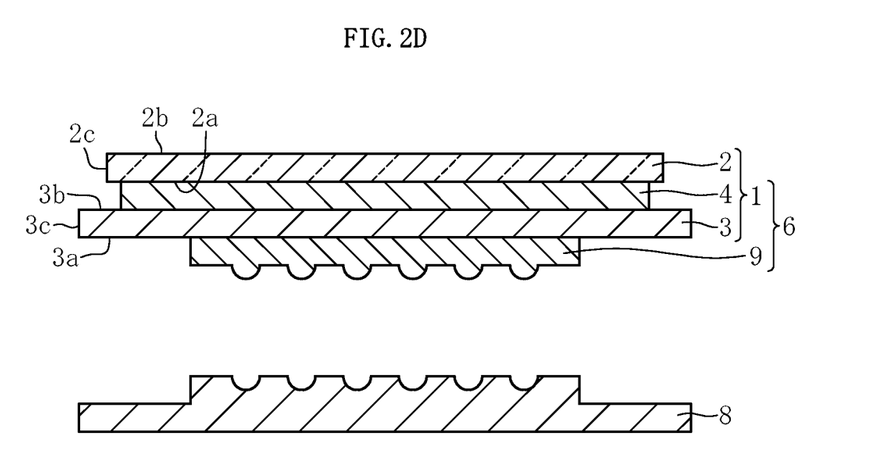
FIG. 2D is a sectional view for illustrating the manufacturing method for the flexible mold according to the first embodiment.

As illustrated in FIG. 2C and FIG. 2D, in the separation step, the master mold 8 and the uneven layer 9 are separated away from each other. In this embodiment, as illustrated in FIG. 2C, the master mold 8 and the uneven layer 9 are separated away from each other while the base 1 having the uneven layer 9 is partially bent. At this time, it is preferred that the master mold 8 be supported in a flat state without being bent. As a matter of course, both the master mold 8 and the base 1 may be supported in a flat state without being bent.

As illustrated in FIG. 2D, the master mold 8 and the uneven layer 9 are completely separated away from each other so that the flexible mold 6 having the uneven layer 9 formed on the first main surface 3a of the resin sheet 3 of the base 1 is manufactured.

Description has been made of the case in which the uneven layer 9 is transferred onto the first main surface 3a of the resin sheet 3 of the base 1. However, the uneven layer 9 may be transferred to the second main surface 2b of the glass sheet 2 of the base 1. In this case, in order to improve adhesion between the glass sheet 2 and the uneven layer 9, it is preferred that the second main surface 2b of the glass sheet 2 be subjected to a surface treatment in advance. Examples of the surface treatment include a silane coupling treatment. The silane coupling treatment is a treatment of applying a silane coupling agent to the second main surface 2b of the glass sheet 2 and thereafter thermally hardening the silane coupling agent at, for example, about 100° C. to form a silane coupling treatment layer. At the time of heating of the silane coupling treatment, when there is a risk that a warp occurs in the base 1 due to the difference in thermal expansion between the glass sheet 2 and the resin sheet 3, in order to prevent the warp, it is preferred that the resin sheet 3 have a thickness of from 0.2 times to 1 time the thickness of the glass sheet 2. Further, in order to prevent the warp, the silane coupling treatment layer may be formed in advance on the second main surface 2b of the glass sheet 2 as a single member before the base 1 is formed, and the second main surface 3b of the resin sheet 3 may thereafter be bonded to the first main surface 2a of the glass sheet 2 through intermediation of the bonding layer 4, thereby manufacturing the base 1.

A manufacturing method for an optical component (product) 10 using the flexible mold 6 having the configuration described above comprises, as illustrated in FIG. 3A to FIG. 3D, an application step, a transfer step, and a separation step.

Figure 3A:
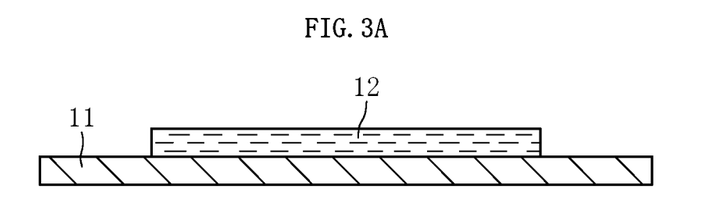
FIG. 3A is a sectional view for illustrating a manufacturing method for a product using the flexible mold according to the first embodiment.

As illustrated in FIG. 3A, in the application step, a liquid molding material 12 is applied to a substrate 11. Examples of the substrate 11 include a resin substrate, a glass substrate, and a composite substrate of those substrates. When an application surface of the substrate 11 is a glass surface, in order to improve adhesion with respect to the molding material 12, it is preferred that the substrate 11 be subjected to a surface treatment such as a silane coupling treatment.

Any material generally used for the imprint method can be used as the molding material 12, and the material may be the same as that of the molding material 7 used for the manufacture of the flexible mold 6, or may be a material of a different kind.

Figure 3B:
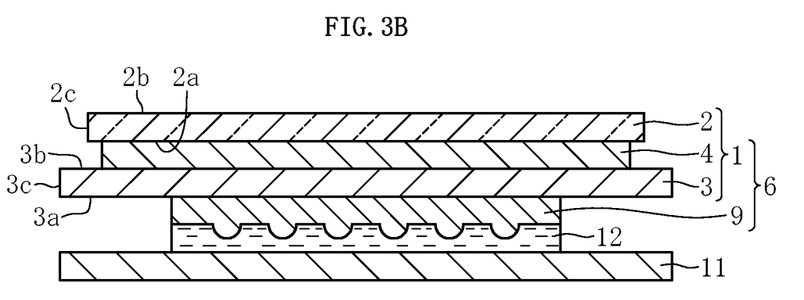
FIG. 3B is a sectional view for illustrating the manufacturing method for the product using the flexible mold according to the first embodiment.

As illustrated in FIG. 3B, in the transfer step, the molding material 12 is sandwiched between the substrate 11 and the flexible mold 6 so that an uneven layer 13 obtained by transferring an uneven pattern of the flexible mold 6 to the molding material 12 is formed on the substrate 11. The uneven layer 13 is obtained by solidifying the molding material 12 under the state in which the molding material 12 is sandwiched between the substrate 11 and the flexible mold 6 (see FIG. 3C).

Figure 3C:
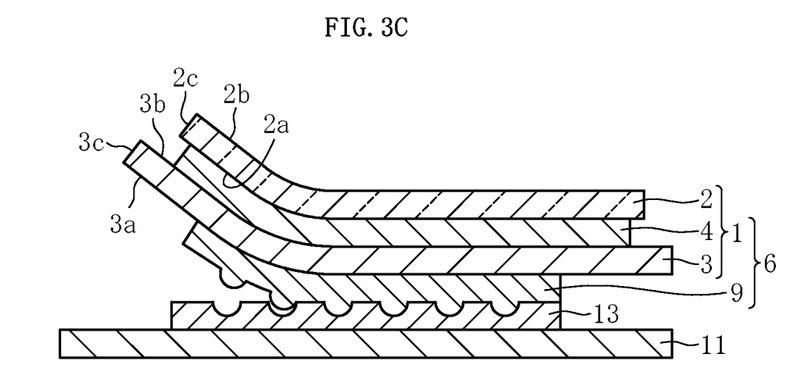
FIG. 3C is a sectional view for illustrating the manufacturing method for the product using the flexible mold according to the first embodiment.
Figure 3D:
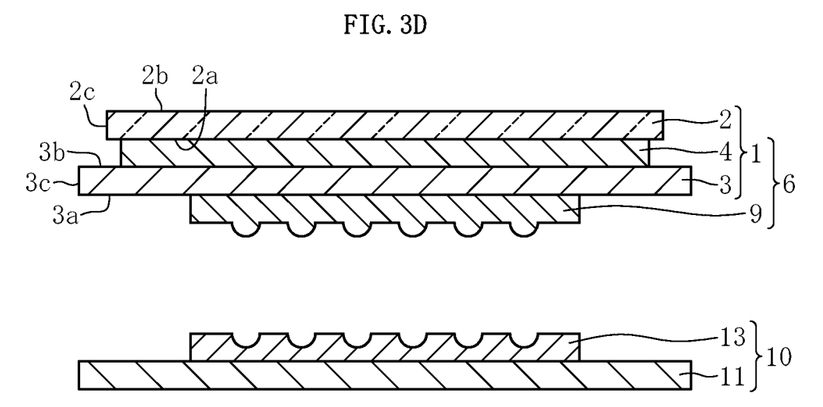
FIG. 3D is a sectional view for illustrating the manufacturing method for the product using the flexible mold according to the first embodiment.

As illustrated in FIG. 3C and FIG. 3D, in the separation step, the flexible mold 6 and the uneven layer 13 are separated away from each other. When the flexible mold 6 and the uneven layer 13 are completely separated away from each other as illustrated in FIG. 3D, the optical component 10 having the uneven layer 13 formed on the substrate 11 is manufactured. The optical component 10 is used for manufacture of, for example, a liquid crystal display (a liquid crystal orientation film), a deflection plate, a micro-lens for an LED, an antireflection film, a diffraction optical element, a single-focus lens, a plasmon filter, or a micro-mirror array.

With the flexible mold 6 having the configuration described above, the resin sheet 3 protrudes from the glass sheet 2 in the base 1. Thus, when another member comes into contact with the end surfaces of the base 1, the end surfaces 3c of the resin sheet 3 preferentially come into contact with the another member. Accordingly, the end surfaces 2c of the glass sheet 2 are less liable to come into contact with the another member. Consequently, in the process of manufacturing the flexible mold 6 (FIG. 2A to FIG. 2D) or in the process of manufacturing the optical component 10 using the flexible mold 6 (FIG. 3A to FIG. 3D), formation of the broken pieces of glass can be reduced. Further, dimensional stability derived from glass can be secured in those processes. Thus, an uneven pattern with high accuracy can be formed.

Second Embodiment

Figure 4:
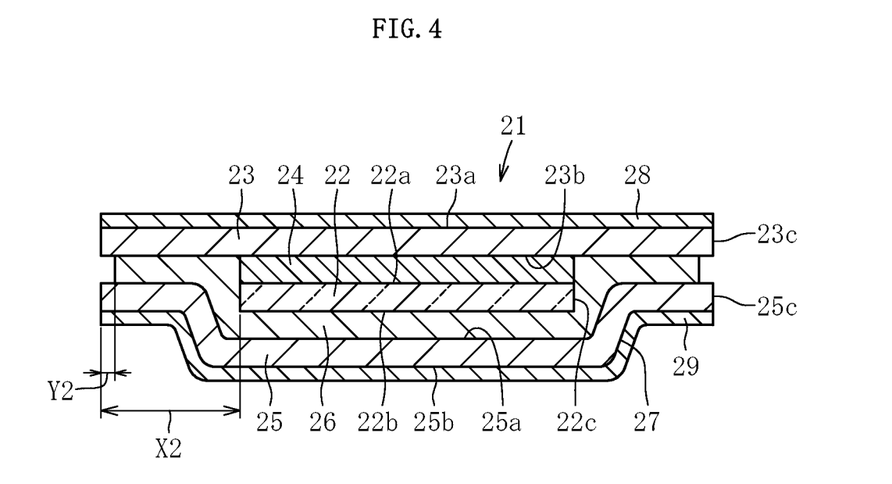
FIG. 4 is a sectional view for illustrating a base for a flexible mold according to a second embodiment.

As illustrated in FIG. 4, abase 21 for a flexible mold according to a second embodiment comprises a glass sheet 22, a first resin sheet 23, a first bonding layer 24, a second resin sheet 25, and a second bonding layer 26. The first bonding layer 24 is configured to bond a first main surface 22a of the glass sheet 22 and a second main surface 23b of the first resin sheet 23 to each other. The second bonding layer 26 is configured to bond a second main surface 22b of the glass sheet 22 and a first main surface 25a of the second resin sheet 25 to each other. That is, the resin sheets 23 and 25 are bonded to both the main surfaces 22a and 22b of the glass sheet 22, respectively. Further, the first bonding layer 24 is smaller than the first resin sheet 23 and is as large as the glass sheet 22. The second bonding layer 26 is as large as the second resin sheet 25 and is larger than the glass sheet 22.

The first resin sheet 23 and the second resin sheet 25 are each larger than the glass sheet 22 and protrude from the glass sheet 22 in plan view in a laminated state. In this embodiment, the resin sheets 23 and 25 each protrude along an entire periphery of the glass sheet 22. That is, in this embodiment, the glass sheet 22 and the resin sheets 23 and 25 each have a rectangular shape, and hence the resin sheets 23 and 25 protrude from all of four sides of the glass sheet 22. With such configuration, when another member comes into contact with the end surfaces of the base 21, end surfaces 23c and 25c of the resin sheets 23 and 25 preferentially come into contact with the another member. Accordingly, end surfaces 22c of the glass sheet 22 are less liable to come into contact with the another member. In addition, both the main surfaces 22a and 22b of the glass sheet 22 are protected by the resin sheets 23 and 25. Accordingly, as compared to the base 1 according to the first embodiment, the glass sheet 22 is less liable to be broken. Further, there is an advantage in that, in case of breakage of the glass sheet 22, broken pieces of glass stay between the resin sheets 23 and 25 and are less liable to scatter to the surrounding.

The first resin sheet 23 is flat in a plane direction of the glass sheet 22, and the second resin sheet 25 comprises step portions 27 which are located at portions protruding from the glass sheet 22 and extend toward the first resin sheet 23 side. Thus, based on the presence or absence of the step portions 27, front and back surfaces of the base 21 and the flexible mold manufactured with use of the base 21 can easily be distinguished.

When the flexible mold is manufactured with use of the base 21, the uneven layer may be formed on a second main surface 25b of the second resin sheet 25 comprising the step portions 27 (preferably, an inner region of the step portions 27). However, it is preferred that the uneven layer be formed on the first main surface 23a of the flat first resin sheet 23. As specific manufacturing methods for the flexible mold and the optical component (product), the methods described in the first embodiment can be similarly applied.

The first resin sheet 23 and the second resin sheet 25 each protrude from the second bonding layer 26. With such configuration, the second bonding layer 26 does not protrude toward the outer side of the base 21. Thus, contamination of a surrounding environment with an adhesive can be prevented.

It is preferred that a protruding amount Y2 of each of the resin sheets 23 and 25 from the second bonding layer 26 be from 0.2 mm to 1 mm. Further, the second bonding layer 26 may protrude from the resin sheets 23 and 25. Further, respective end surfaces of the second bonding layer 26 and the resin sheets 23 and 25 may be located on the same plane.

The second bonding layer 26 protrudes from the glass sheet 22 and is bonded to the first resin sheet 23 on the outer side of the glass sheet 22. As a result, the end surfaces 22c of the glass sheet 22 are covered by the second bonding layer 26. With such configuration, the end surfaces 22c of the glass sheet 22 are protected by the second bonding layer 26. Thus, formation of broken pieces of glass from the end surfaces 22c of the glass sheet 22 can reliably be suppressed. Further, in case of breakage of the end surfaces 22c of the glass sheet 22, glass pieces are less liable to scatter to the surrounding.

It is preferred that a protruding amount X2 of each of the resin sheets 23 and 25 from the glass sheet 22 be from 0.2 mm to 100 mm. When the end surfaces 22c of the glass sheet 22 are covered by the second bonding layer 26 as in this embodiment, in order to easily secure the thickness of the bonding layer covering the end surfaces 22c, it is more preferred that the protruding amount X2 be from 2 mm to 100 mm.

In this embodiment, the base 21 further comprises a first protective film 28 and a second protective film 29. The first protective film 28 is removably affixed to the first main surface 23a of the first resin sheet 23. The second protective film 29 is removably affixed to the second main surface 25b of the second resin sheet 25. With such configuration, damage and adhesion of dirt on the surface of the base 21 can be prevented. Any one or both of the protective films 28 and 29 may be omitted.

Regarding the thicknesses and the materials of the glass sheet 22, the resin sheets 23 and 25, the bonding layers 24 and 26, and the protective films 28 and 29, the thicknesses and the materials of the corresponding configurations described in the first embodiment can be similarly applied.

The present invention is not limited to the above-mentioned embodiments. The present invention maybe carried out in various modes without departing from the spirit of the present invention.

In the above-mentioned embodiments, description has been made of the case in which the resin sheet protrudes along the entire periphery of the glass sheet in the base for the flexible mold. However, the resin sheet may protrude from only a part of the periphery of the glass sheet.

Figure 5:
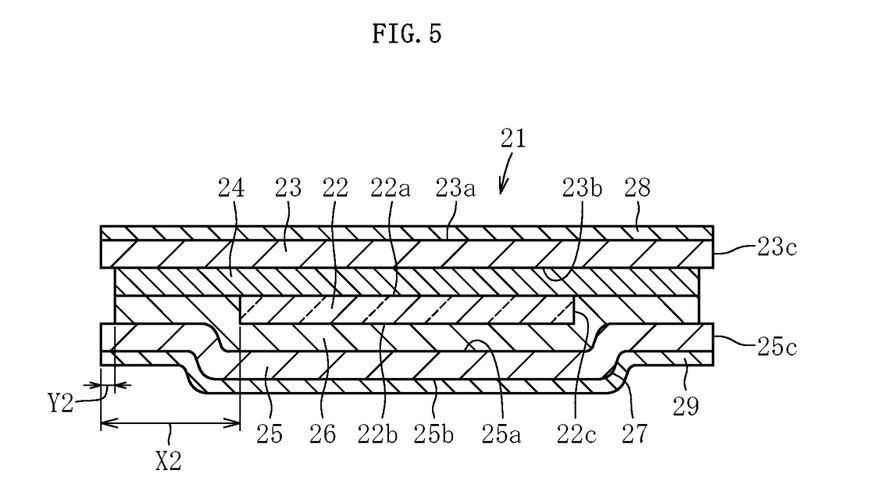
FIG. 5 is a sectional view for illustrating a base for a flexible mold according to a modification example of the second embodiment.

In the above-mentioned embodiments, description is given of the case in which the first bonding layer 24 is as large as the glass sheet 22. However, as illustrated in FIG. 5, the first bonding layer 24 may be as large as the first resin sheet 23.

REFERENCE SIGNS LIST 1 base
2 glass sheet
3 resin sheet
4 bonding layer
5 protective film
6 flexible mold
7 molding material
8 master mold
9 uneven layer
10 optical component
11 substrate
12 molding material
13 uneven layer
21 base
22 glass sheet
23 first resin sheet
24 first bonding layer
25 second resin sheet
26 second bonding layer
27 step portion
28 first protective film
29 second protective film

The invention claimed is:

1. A base for a flexible mold, the base comprising:
    a glass sheet;
    a resin sheet; and
    a bonding layer configured to bond the glass sheet and the resin sheet to each other,
    wherein the resin sheet protrudes laterally from the glass sheet over an end surface of the glass sheet,
    wherein the glass sheet and the resin sheet each protrude laterally from the bonding layer over an end surface of the bonding layer,
    wherein the resin sheet is bonded to only one main surface of the glass sheet through intermediation of the bonding layer,
    wherein a protruding amount that the resin sheet protrudes laterally from the glass sheet is from 0.2 mm to 1 mm, and
    wherein a protruding amount that the glass sheet protrudes laterally from the bonding layer is from 0.2 mm to 1 mm.

2. The base according to claim 1, wherein the resin sheet has a thickness of from 0.2 times to 1 time a thickness of the glass sheet.

3. A base for a flexible mold, the base comprising:
    a glass sheet;
    a pair of resin sheets; and
    a pair of bonding layers, each of the bonding layers configured to bond the glass sheet and one of the resin sheets to each other,
    wherein the resin sheets protrude laterally from the glass sheet over an end surface of the glass sheet,
    wherein the resin sheets protrude laterally from the bonding layers over respective end surfaces of the bonding layers,
    wherein the resin sheets are bonded to both main surfaces of the glass sheet through intermediation of the bonding layers,
    wherein a protruding amount that each of the resin sheets protrudes laterally from the glass sheet is from 0.2 mm to 1 mm, and
    wherein a protruding amount that each of the resin sheets protrudes laterally from one of the bonding layers is from 0.2 mm to 1 mm.

4. The base according to claim 3, wherein the resin sheets each have a thickness of from 0.2 times to 1 time a thickness of the glass sheet.

5. The base according to claim 3, wherein
    one of the resin sheets is flat in a plane direction of the glass sheet, and
    another of the resin sheets comprises step portions, which are located at portions protruding from the glass sheet and extend toward the one of the resin sheets.

* * * * *